United States Patent
Fu

(10) Patent No.: US 10,209,701 B2
(45) Date of Patent: Feb. 19, 2019

(54) METHOD OF TEMPERATURE CONTROL AND CABINET

(71) Applicants: INVENTEC (PUDONG) TECHNOLOGY CORPORATION, Shanghai (CN); INVENTEC CORPORATION, Taipei (TW)

(72) Inventor: Zhen-He Fu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 57 days.

(21) Appl. No.: 15/455,004

(22) Filed: Mar. 9, 2017

(65) Prior Publication Data

US 2018/0157281 A1 Jun. 7, 2018

(30) Foreign Application Priority Data

Dec. 2, 2016 (CN) .......................... 2016 1 1096906

(51) Int. Cl.
*G05D 23/19* (2006.01)
*G05B 19/406* (2006.01)
*H05K 7/20* (2006.01)

(52) U.S. Cl.
CPC ....... *G05B 19/406* (2013.01); *G05D 23/1919* (2013.01); *G05D 23/1931* (2013.01); *H05K 7/20209* (2013.01); *G05B 2219/42018* (2013.01)

(58) Field of Classification Search
CPC .............. G05D 23/1917; G05B 19/406; G05B 2219/42018; G05B 13/0275; G05B 13/0285; G05B 13/0295; G05B 2219/34065; G05B 2219/34066; G05B 2219/34067; G05B 2219/34068; G05B 2219/34077; G05B 2219/34081; G05B 2219/42047; G05B 2219/42057;
(Continued)

(56) References Cited

U.S. PATENT DOCUMENTS

| 4,583,684 A * | 4/1986 | Watabe | F25B 41/04 165/253 |
| 5,173,224 A * | 12/1992 | Nakamura | B29C 45/78 264/328.14 |

OTHER PUBLICATIONS

Temperature Control using Fuzzy Logic (International Journal of Instrumentation and Control Systems (IJICS) vol. 4, No. 1, Jan. 2014), by: Singhala, Year: 2014.*

(Continued)

*Primary Examiner* — Robert E Fennema
*Assistant Examiner* — Jigneshkumar C Patel
(74) *Attorney, Agent, or Firm* — Maschoff Brennan

(57) ABSTRACT

A method of temperature control is applied to a cabinet in which a fan is disposed and the fan runs based on an input signal. The method includes obtaining a temperature signal corresponding to the cabinet, calculating a deviation signal between the input signal and the temperature signal, executing fuzzy learning to obtain a first proportional parameter, a first integral parameter and a first derivative parameter based on the deviation signal, generating a driver signal to execute a proportional-integral-derivative (PID) control based on the first proportional parameter, the first integral parameter and the first derivative parameter, wherein the driver signal is for driving the fan to adjust a temperature of the cabinet.

8 Claims, 3 Drawing Sheets

(58) Field of Classification Search
CPC ........... G05B 2219/42081; G05B 2219/42134; G05B 2219/42137
USPC .......................................... 700/299, 42, 50
See application file for complete search history.

(56) References Cited

OTHER PUBLICATIONS

Fuzzy Logic Method for Autotuning a PID Controller: SISO and MIMO Systems (Copyright© 2002 IFAC 15th Triennial World Congress, Barcelona, Spain), by: Almeida, Year: 2002.*

* cited by examiner

METHOD OF TEMPERATURE CONTROL AND CABINET

CROSS-REFERENCE TO RELATED APPLICATIONS

This non-provisional application claims priority under 35 U.S.C. § 119(a) on Patent Application No(s). 201611096906.3 filed in China on Dec. 2, 2016, the entire contents of which are hereby incorporated by reference.

BACKGROUND

Technical Field

This disclosure relates to a cabinet, and more particularly to a cabinet which includes a temperature sensor.

Related Art

For industrial manufacture and testing, a temperature is a common parameter so that measurement and control of the temperature are generally applied in various fields. A conventional method of temperature control is that the cabinet is capable of automatically adjusting the internal temperature to match a preset temperature. However, when the cabinet is set in a complex operation environment (e.g. a number of cabinets set together), a large change is easily generated in the environment temperature. The cabinet, which is merely able to sense the internal temperature, cannot immediately react to the change in the environment temperature, so that the damages may occur to the internal components of the cabinet due to the large change in the environment temperature.

SUMMARY

According to one or more embodiments of this disclosure, a method of temperature control is applied to a cabinet in which a fan is disposed and operates based on an input signal. The method includes the following steps: obtaining a temperature signal corresponding to the cabinet; calculating a deviation signal between the input signal and the temperature signal; executing fuzzy learning, based on the deviation signal, to obtain a first proportional coefficient, a first integral coefficient and a derivative coefficient; and generating a driving signal, based on the first proportional coefficient, the first integral coefficient and the first derivative coefficient, to execute a proportional-integral-derivative (PID) control wherein the driving signal is generated for driving the fan to adjust a temperature of the cabinet.

According to one or more embodiments of this disclosure, a cabinet includes a fan, a temperature sensor, a fuzzy learning module and a PID control module. The deviation calculating module is coupled to the temperature sensor and the fuzzy learning module, and the PID control module is coupled to the fuzzy learning module. The fan is configured to operate based on an input signal. The temperature sensor is configured to obtain a temperature signal corresponding to the cabinet. The deviation calculating module is configured to calculate a deviation signal between the input signal and the temperature signal. The fuzzy learning module is configured to execute fuzzy learning, based on the deviation signal, to obtain a first proportional coefficient, a first integral coefficient and a derivative coefficient. The PID control module is configured to generate a driving signal, based on the first proportional coefficient, the first integral coefficient and the first derivative coefficient, to execute a PID control, wherein the driving signal is generated for driving the fan to adjust a temperature of the cabinet.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
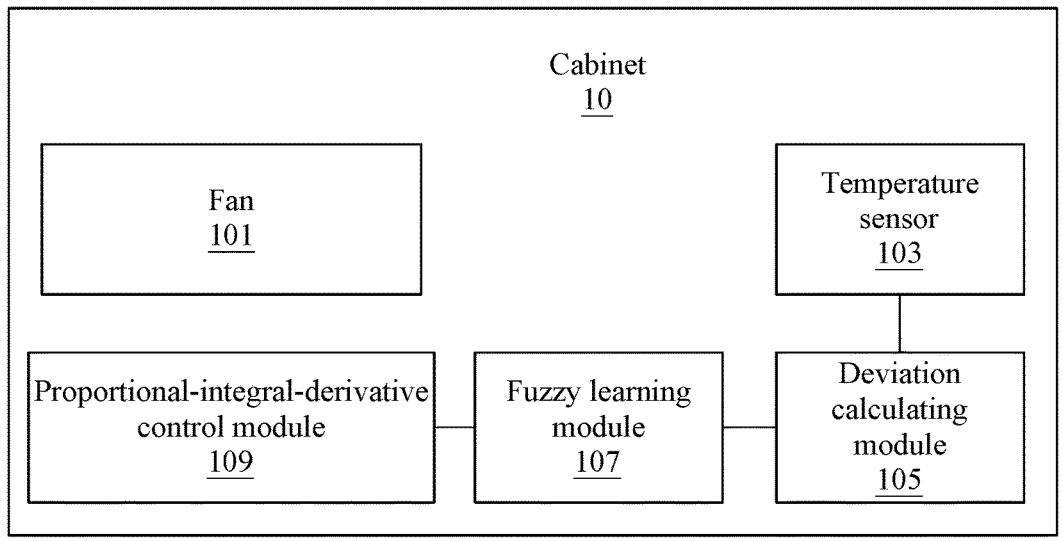
FIG. 1 is a functional block diagram of a cabinet in an embodiment of this disclosure.

Please refer to FIG. 1, which is a functional block diagram of a cabinet in an embodiment of this disclosure. As shown in FIG. 1, a cabinet 10 includes a fan 101, a temperature sensor 103, a deviation calculating module 105, a fuzzy learning module 107 and a proportional-integral-derivative (PID) control module 109. The deviation calculating module 105 is coupled to the temperature sensor 103 and the fuzzy learning module 107, and the PID control module 109 is coupled to the fuzzy learning module 107.

For example, the fan 101 is a cooling fan for dissipating the heat in the cabinet 10, and is configured to operate based on a input signal, which relates to a preset temperature value of the cabinet or a temperature value set by a user, and this disclosure is not limited to it. The temperature sensor 103 is, for example, a temperature measurement circuit, and is configured to obtain a temperature signal of the cabinet. In an embodiment, the temperature measurement circuit, by 3-wire resistance temperature detection, transforms a temperature value, related to the cabinet, into a differential voltage signal. Next, the differential voltage signal is amplified by an amplifier and is converted into a current signal or a voltage signal by digital-to-analog conversion. Then, the temperature measurement circuit transmits the current signal or the voltage signal to the deviation calculating module 105. The deviation calculating module 105 is, for example, a subtractor, and is configured to calculate a deviation signal between the input signal and the temperature signal. The fuzzy learning module 107 is, for example, software, for executing fuzzy learning, based on the deviation signal, to obtain a first proportional coefficient, a first integral coefficient and a derivative coefficient. As another example, the fuzzy learning module 107 is a chip which is configured to execute fuzzy learning, based on the deviation signal, to obtain the above coefficients. The PID control module 109 is, for example, an advanced reduced-instruction-set-computing machine (ARM) chip, and is configured to generate a driving signal, based on the first proportional coefficient, the first integral coefficient and the first derivative coefficient, to execute a proportional-integral-derivative (PID) control wherein the driving signal is generated for driving the fan to adjust a temperature of the cabinet.

Figure 2:
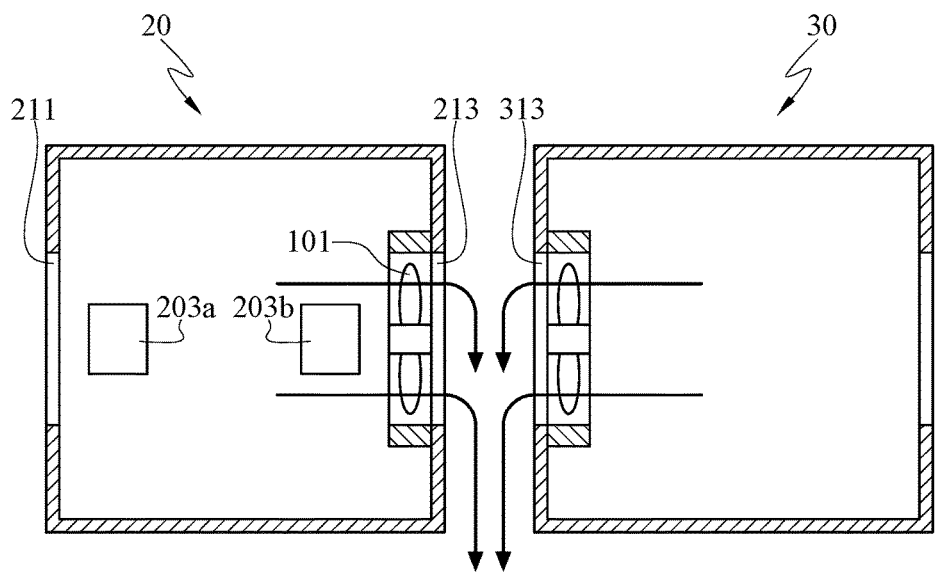
FIG. 2 is a schematic diagram of an operation environment of a cabinet in an embodiment of this disclosure.

Please refer to FIG. 1 and FIG. 2. FIG. 2 is a schematic diagram of an operation environment of a cabinet in an embodiment of this disclosure. In an embodiment, the cabinet 20 includes the fan 101, the temperature sensor 103, the deviation calculating module 105, the fuzzy learning module 107 and the PID control module 109, as shown in FIG. 1. Therefore, the functions of the above components and the connection relationship among the above components are not described again. Besides the above components, the cabinet 20 further has an air inlet 211 and an air outlet 213, and the fan 201 of the cabinet 20 is set at the air inlet 211 or the air outlet 213. As shown in FIG. 2, the cabinet 20 is arranged near a second cabinet 30 during the operation. For example, the second cabinet 30 belongs to the type of the cabinet 20, or another type of cabinets which has an air outlet, and this disclosure is not limited to it. In this embodiment, the temperature sensor 103 of the cabinet 20 obtains the temperature signal corresponding to the cabinet 20. The temperature signal includes a first temperature corresponding to the air inlet 211 and a second temperature corresponding to the air outlet 213. More specifically, the temperature sensor 103 includes, for example, two temperature sensing components 203a, 203b, which are respectively disposed at the air inlet 211 and the air outlet 213 of the cabinet 20. The temperature sensing component 203a senses the first temperature corresponding to the air inlet 211, and the temperature sensing component 203b senses the second temperature corresponding to the air outlet 213. Therefore, the cabinet 20 senses the ambient temperature by the temperature sensing components 203a, 203b to obtain the temperature signal. Then, the temperature signal is processed by the deviation calculating module 105, the fuzzy learning module 107 and the PID control module 109 to generate the driving signal to control the fan 201. In other words, the cabinet 20 is capable of controlling the fan 101 to adjust the temperature of the cabinet 20 based on the ambient temperature. For example, when the air outlet 213 of the cabinet 20 is opposite to the air outlet 313 of the second cabinet 30 and the second cabinet 30 emits heat, the temperature sensing component 103b, which is at the air outlet 213 of the cabinet 20 senses a temperature signal and transmits it to the deviation calculating module 105. Then, the deviation calculating module 105 calculates a deviation signal between the input signal and the temperature signal. The fuzzy learning module 107 obtains a first proportional coefficient, a first integral coefficient and a first derivative coefficient based on the deviation signal. The PID control module 109 generates a driving signal, based on the coefficients obtained by the fuzzy learning module 107, to drive the fan so that the cabinet 20 is able to immediately react to the heat output by the second cabinet 30. Conventionally, because the cabinet cannot real-time senses the environment temperature, the temperature of the cabinet increases rapidly as the environment temperature increases rapidly, so that the internal components of the cabinet are damaged. In this embodiment, the above situation may be avoided.

Figure 3:
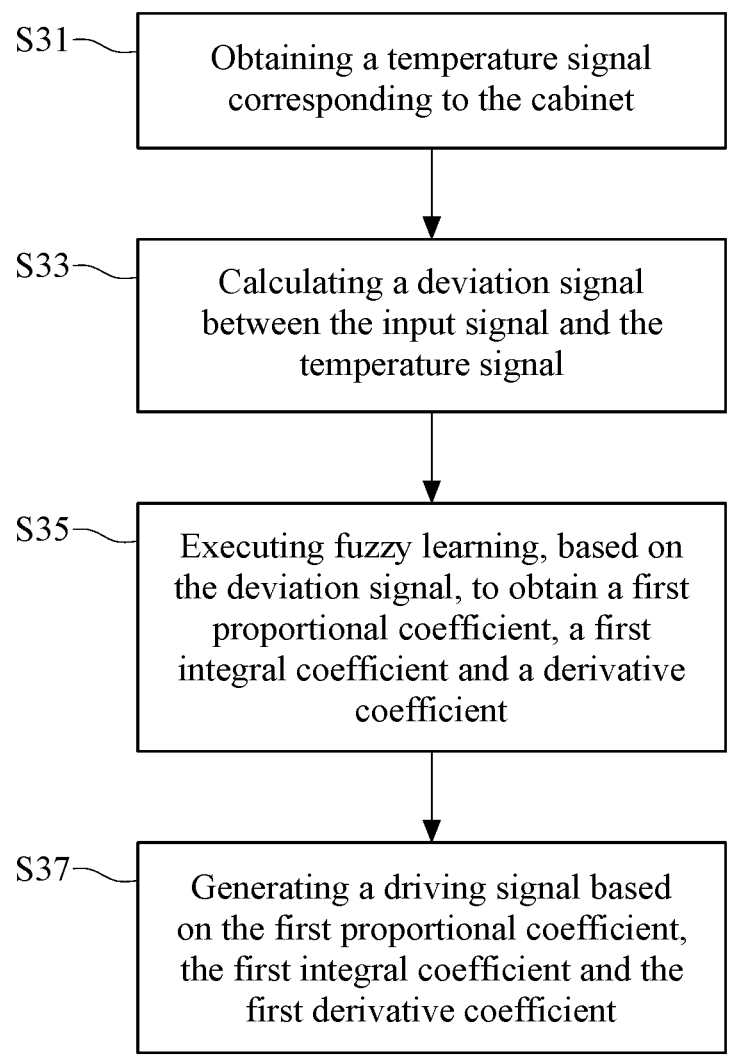
FIG. 3 is a flow chart of a method of temperature control in an embodiment of this disclosure.

Please refer to FIG. 1 to FIG. 3. FIG. 3 is a flow chart of a method of temperature control in an embodiment of this disclosure. In an embodiment, the method of temperature control is applied to the cabinet 10 as shown in FIG. 1. In step S31, the temperature sensor 103 obtains a temperature signal corresponding to the cabinet. In another embodiment, the method of temperature control is applied to the cabinet 20 as shown in FIG. 2. The temperature signal, obtained by the temperature sensor 103, includes the first temperature corresponding to the air inlet 211 and the second temperature corresponding to the air outlet 213. In step S33, the deviation calculating module 105 calculates the deviation signal between the input signal and the temperature signal. In step S35, the fuzzy learning module 107 executes the fuzzy learning, based on the deviation signal, to obtain the first proportional coefficient, the first integral coefficient and the first derivative coefficient. In an embodiment, the deviation signal includes a deviationvalue and a variation rate of the deviationvalue. The fuzzy learning module 107 determines whether the deviationvalue is out of a first preset range, and whether the variation rate of the deviationvalue is out of a second preset range. When the deviationvalue is out of the first preset range or the variation rate of the deviationvalue is out of the second preset range, the fuzzy learning module 107 adjusts the variation rate of the deviationvalue. When the deviationvalue is in the first preset range and the variation rate of the deviationvalue is in the second preset range, the fuzzy learning module 107 executes the fuzzy learning. In an embodiment, the deviation signal between the input signal and the temperature signal includes the deviationvalue and the variation rate of the deviationvalue, and the fuzzy learning module 107 transforms the deviationvalue and the variation rate of the deviationvalue using a fuzzy domain based on a quantification factor to obtain a second proportional coefficient, a second integral coefficient and a second derivative coefficient, and defuzzifies the second proportional coefficient, the second integral coefficient and the second derivative coefficient to obtain the first proportional coefficient, the first integral coefficient and the first derivative coefficient. In step S37, the PID control module 109 generates the driving signal, based on the first proportional coefficient, the first integral coefficient and the first derivative coefficient, to execute the PID control. The driving signal is generated for driving the fan to adjust a temperature of the cabinet. In an embodiment, the PID control module 109 calculates a duty cycle of pulse width modulation (PWM), based on the first proportional coefficient, the first integral coefficient and the first derivative coefficient, to drive the fan 101.

Figure 4:
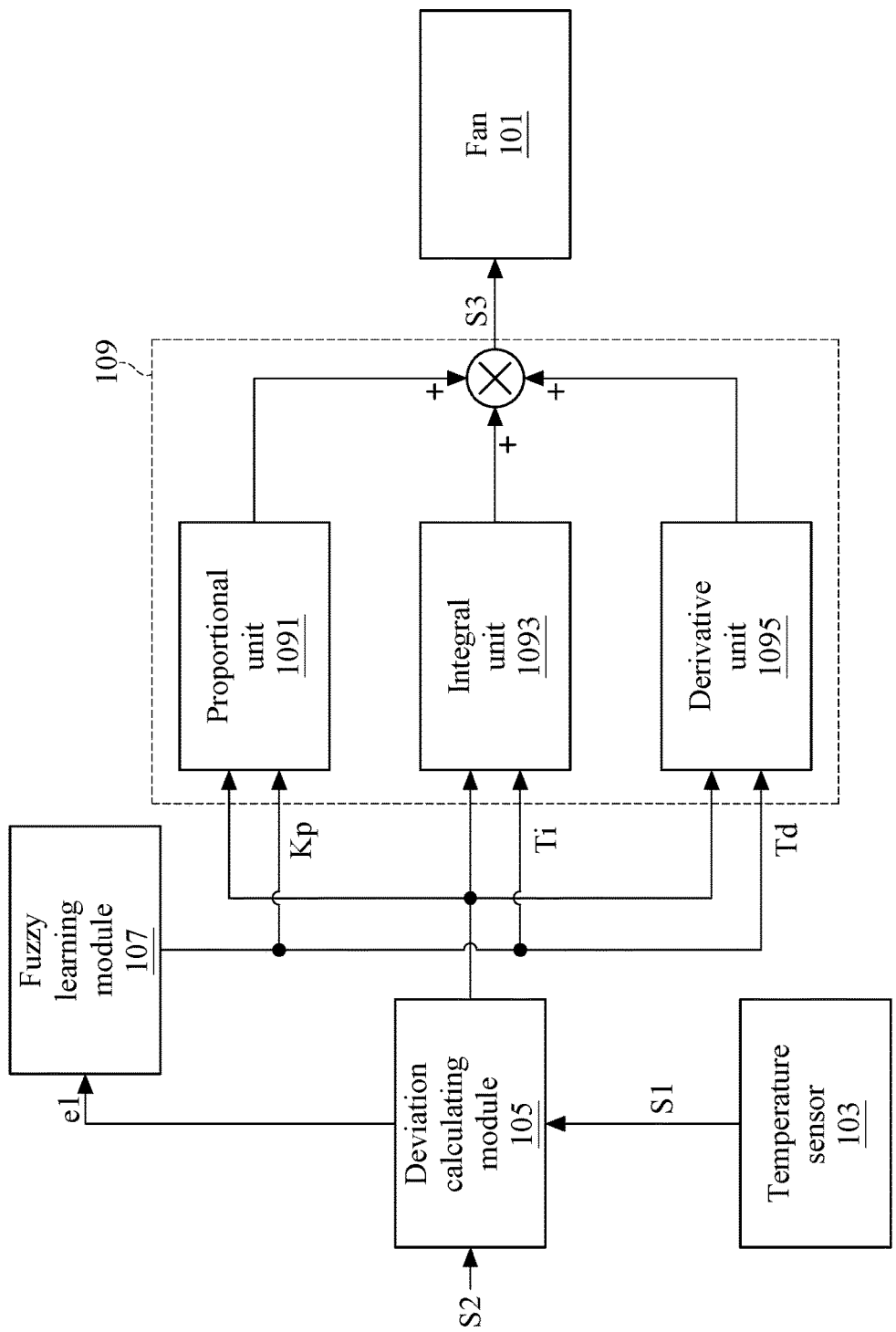
FIG. 4 is a schematic diagram of signal processing of a cabinet in an embodiment of this disclosure.

Please refer to FIG. 1 and FIG. 4. FIG. 4 is a schematic diagram of signal processing of a cabinet in an embodiment of this disclosure. The temperature sensor 103 obtains the temperature signal S1 corresponding to the cabinet 10, and transmits it to the deviation calculating module 105. The deviation calculating module 105 calculates the deviation signal e1 between the input signal S2 and the temperature signal S1 and then transmits the deviation signal e1 to the fuzzy learning module 107 for the execution of the fuzzy learning. The fuzzy learning module 107 obtains the first proportional coefficient Kp, the first integral coefficient Ti and the first derivative coefficient Td by the fuzzy learning, and respectively transmits the above coefficients Kp, Ti, and Td to a proportional unit 1091, a integral unit 1093 and a derivative unit 1095 of the PID control module 109. The PID control module 109 generates the driving signal S3, based on the first proportional coefficient Kp, the first integral coefficient Ti and the first derivative coefficient Td, to control the rotation speed of the fan 101. In an embodiment, the temperature sensor 103 has transmitted the obtained temperature signal S1 to the deviation calculating module 105 until the value indicated by the temperature signal S1 and the value indicated by the input signal S2 are the same, or the difference between these two values is smaller than a threshold value, in order to avoid damages to interior components caused by large variations in the temperature of the cabinet 10.

In view of the above structure, the method of temperature control and the cabinet provided in this disclosure sense a temperature signal corresponding to the cabinet, generate a driving signal by fuzzy learning and a PID algorithm, and execute PID control of the fan of the cabinet to adjust the temperature of the cabinet. Therefore, when the cabinet is set at an air outlet of another cabinet a large change in an environment temperature (e.g. increased temperature resulted from the heat output by other cabinet when the cabinet is set at an air outlet of the other cabinet), the method of temperature control and the cabinet provided in this disclosure may generate the driving signal following the change in the environment temperature to control the rotation speed of the fan, so that damages to internal components in the cabinet caused by the large change in the temperature can be avoided.

What is claimed is:

1. A method of temperature control, applied to a cabinet in which a fan is disposed and operates based on an input signal, and the method comprising steps of:
    obtaining a temperature signal corresponding to the cabinet;
    calculating a deviation signal between the input signal and the temperature signal;
    executing fuzzy learning, based on the deviation signal, to obtain a first proportional coefficient, a first integral coefficient and a derivative coefficient; and
    generating a driving signal, based on the first proportional coefficient, the first integral coefficient and the first derivative coefficient, to execute a proportional-integral-derivative (PID) control wherein the driving signal is generated for driving the fan to adjust a temperature of the cabinet;
    wherein the deviation signal comprises a deviationvalue and a variation rate of the deviationvalue, and the step of executing fuzzy learning, based on the deviation signal, to obtain the first proportional coefficient, the first integral coefficient and the derivative coefficient comprises:
    transforming the deviationvalue and the variation rate of the deviationvalue into a fuzzy domain based on a quantification factor to obtain a second proportional coefficient, a second integral coefficient and a second derivative coefficient; and
    defuzzifying the second proportional coefficient, the second integral coefficient and the second derivative coefficient to obtain the first proportional coefficient, the first integral coefficient and the first derivative coefficient.

2. The method according to claim 1, wherein the cabinet has an air inlet and an air outlet, the temperature signal comprises a first temperature corresponding to the air inlet and a second temperature corresponding to the air outlet, and the fan is disposed at the air inlet or the air outlet.

3. The method according to claim 1, wherein the step of executing fuzzy learning, based on the deviation signal, to obtain the first proportional coefficient, the first integral coefficient and the derivative coefficient comprises:
    determining whether the deviationvalue is out of a first preset range, and whether the variation rate of the deviationvalue is out of a second range; and
    when the deviationvalue is out of the first preset range, or the variation rate of the deviationvalue is out of a second preset range, adjust the variation rate of the deviationvalue.

4. The method according to claim 1, wherein the step of generating the driving signal, based on the first proportional coefficient, the first integral coefficient and the first derivative coefficient, to execute the PID control comprises:
    based on the first proportional coefficient, the first integral coefficient and the first derivative coefficient, calculating a duty cycle of pulse width modulation (PWM) to drive the fan.

5. A cabinet, comprising:
    a fan configured to operate based on an input signal;
    a temperature sensor configured to obtain a temperature signal corresponding to the cabinet;
    a deviation calculating module coupled to the temperature sensor, and configured to calculate a deviation signal between the input signal and the temperature signal;
    a fuzzy learning module coupled to the deviation calculating module, and configured to execute fuzzy learning, based on the deviation signal, to obtain a first proportional coefficient, a first integral coefficient and a derivative coefficient; and
    a PID control module coupled to the fuzzy learning module, and configured to generate a driving signal, based on the first proportional coefficient, the first integral coefficient and the first derivative coefficient, to execute a PID control, wherein the driving signal is generated for driving the fan to adjust a temperature of the cabinet;
    wherein the deviation signal comprises a deviationvalue and a variation rate of the deviationvalue, and the fuzzy learning module is further configured to transform the deviationvalue and the variation rate of the deviationvalue into a fuzzy domain, based on a quantification factor, to obtain a second proportional coefficient, a second integral coefficient and a second derivative coefficient, and defuzzify the second proportional coefficient, the second integral coefficient and the second derivative coefficient to obtain the first proportional coefficient, the first integral coefficient and the first derivative coefficient.

6. The cabinet according to claim 5, wherein the cabinet has an air inlet and an air outlet, the temperature signal comprises a first temperature corresponding to the air inlet and a second temperature corresponding to the air outlet, and the fan is disposed at the air inlet or the air outlet.

7. The cabinet according to claim 5, wherein the fuzzy learning module is further configured to determine whether the deviationvalue is out of a first preset range, and whether the variation rate of the deviationvalue is out of a second range, and when the deviationvalue is out of the first preset range, or the variation rate of the deviationvalue is out of a second preset range, adjust the variation rate of the deviationvalue.

8. The cabinet according to claim 5, wherein the PID control module is further configured to calculating a duty cycle of pulse width modulation (PWM), based on the first proportional coefficient, the first integral coefficient and the first derivative coefficient, to drive the fan.

* * * * *